United States Patent [19]

Fähnrich et al.

[11] Patent Number: 4,656,395

[45] Date of Patent: Apr. 7, 1987

[54] ACCESSORY CIRCUIT STRUCTURE FOR A LOW-PRESSURE DISCHARGE LAMP, TYPICALLY FLUORESCENT LAMP

[75] Inventors: Hans-Jürgen Fähnrich, Munich; Erhard Rasch, Ottobrunn, both of Fed. Rep. of Germany

[73] Assignee: Patent-Treuhand-Gesellschaft fur elektrische Gluhlampen mbH, Munich, Fed. Rep. of Germany

[21] Appl. No.: 779,245

[22] Filed: Sep. 23, 1985

[30] Foreign Application Priority Data

Oct. 12, 1984 [DE] Fed. Rep. of Germany ....... 3437527

[51] Int. Cl.4 .............................................. H01J 7/44
[52] U.S. Cl. .................................... 315/57; 174/68.5; 315/58; 315/62; 336/200; 336/223
[58] Field of Search ............... 336/200, 223, 239, 192; 330/66; 174/68.5; 315/57, 62

[56] References Cited

U.S. PATENT DOCUMENTS

| 3,092,786 | 6/1963 | Bayne | 331/113 |
| 3,155,875 | 11/1964 | Wenrich et al. | 315/189 |
| 3,611,021 | 10/1971 | Wallace | 315/239 |
| 3,753,071 | 8/1973 | Engel et al. | 315/DIG. 7 |
| 4,103,267 | 7/1978 | Olschewski | 336/200 |
| 4,249,229 | 2/1981 | Hester | 336/200 |
| 4,455,545 | 6/1984 | Shelly | 336/200 |
| 4,522,671 | 6/1985 | Griinwald | 336/200 |

Primary Examiner—Harold Dixon
Attorney, Agent, or Firm—Frishauf, Holtz, Goodman & Woodward

[57] ABSTRACT

To facilitate assembly of tiny cores used in accessory circuitry for a fluorescent lamp, bases of two transistors (20, 20') are connected to inductive windings on a core (2) which is retained by a primary winding (3) on the printed circuit (PC) board (1). The windings connected to the bases are formed by U-shaped wires surrounding the core which—preferably—is a toroidal core. The windings may include a resistor (8, 8') located within the toroidal core to heat quickly and, also, heat the core, the resistor extending at right angles to the PC board and forming one leg of the U-shaped conductor legs forming the impedance winding around the core.

6 Claims, 3 Drawing Figures

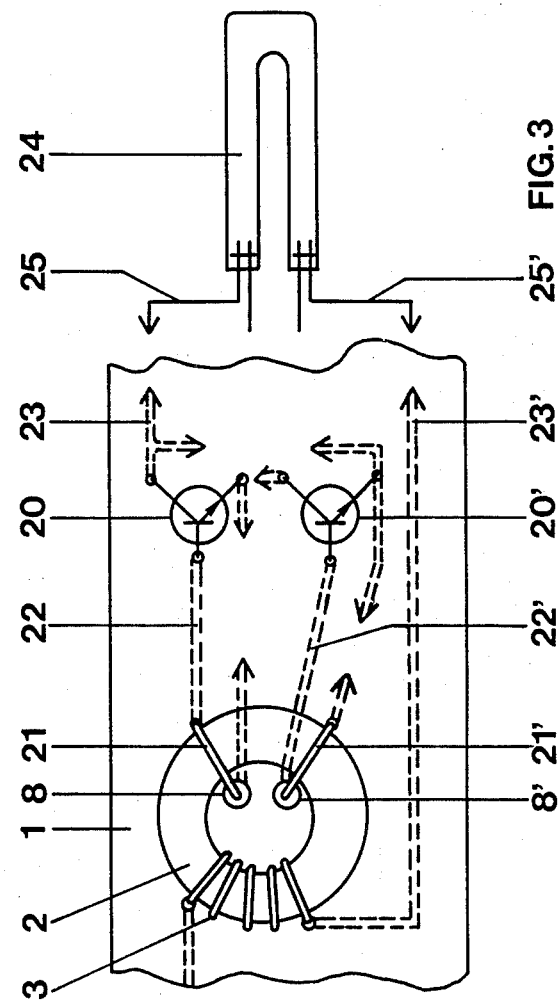

ACCESSORY CIRCUIT STRUCTURE FOR A LOW-PRESSURE DISCHARGE LAMP, TYPICALLY FLUORESCENT LAMP

REFERENCE TO RELATED PUBLICATION

Textbook: "Elektronikschaltungen" ("Electronic Circuits") by Walter Hirschmann, published by SIEMENS AG, 1982, particularly pages 147 and 148, Berlin/Munich.

The present invention relates to an accessory circuit structure, particularly for use with fluorescent lamps, and especially for use with low-wattage, single-ended compact fluorescent lamps, in which the various circuit structure components are retained on a support plate, for example a printed circuit (PC) board.

BACKGROUND

Accessory circuits for operation of a fluorescent lamp, and particularly for low-power, single-ended fluorescent lamps, are well known, and the referenced publication "Elektronikschaltungen" ("Electronic Circuits") by Walter Hirschmann, published by SIEMENS AG, 1982, particularly pages 147 and 148, describes a circuit having a pair of transistors, the bases of which are connected to a control circuit which includes an inductive impedance and, if necessary, an ohmic series resistor. The two inductive impedances each have one winding and are located on a common transformer core.

The transformer core, typically, is a toroidal core or ring-shaped core which is tiny. It operates as a saturating transformer, and has an outer diameter of only about 12 mm; the inner diameter of the core is only about 5 mm.

It has been found that it is particularly difficult to apply one or more windings to such a core, particularly under mass production conditions. The tiny core dimensions make it difficult to apply windings thereon. It is rather difficult to apply one winding over a portion of the circumference of the core; adding a further winding, and particularly adding further windings beyond the first one, is extremely difficult and time-consuming.

THE INVENTION

It is an object to improve the circuit structure for an accessory circuit for low-pressure discharge lamps, typically fluorescent lamps, in which the circuit as described and as known can be used, and in which the structural arrangement permits ready manufacture, particularly under mass production conditions, without, however, interfering with the electrical data and the operation of the known circuit.

Briefly, a printed circuit board is provided formed with conductive tracks thereon. The core is retained on the printed circuit board by a primary winding, and additional windings, connected to bases of the transistors, which can be secured to the printed circuit (PC) board, or may be in form of a single chip, are formed by essentially U-shaped wires which have a pair of legs surrounding, at least in part, the core. The legs themselves are soldered to suitable conductive tracks on the PC board. If more than one winding is needed, the PC board may be formed with connecting conductive tracks, and two or more such U-shaped wires, surrounding for example the top and sides of the core, with the bottom placed against the PC board, directly or with an intermediate spacer.

In accordance with a feature of the invention, the U-shaped wire may be part of an end lead of a resistor which for example may be located within the opening of the ring-shaped core.

The arrangement has the advantage that each winding of the inductive resistor can be readily formed, since a U-shaped bent wire is easily made surrounding the transformer core and soldered to conductive tracks on the PC board. When forming the wire as the end lead of a resistor, separate construction of an inductive impedance-resistance combination can be essentially eliminated. The resistors are, preferably, located within the opening of the toroidal transformer, extending perpendicularly with respect to the PC board. This is a particularly desirable arrangement since such resistors usually have a negative temperature coefficient of resistance and thus rapidly heat the core and thereby decrease the starting period of fluorescent lamps to which the circuit is connected.

The invention is not limited to inductive impedances with only a single winding, since several such windings can be located on the same transformer core, completed by suitable tracks on the PC board to form electrically continuous loops.

DRAWINGS

FIG. 3 is a top view, partly schematic, partly illustrative, of a portion of an accessory circuit for a fluorescent lamp, and utilizing the structure of FIG. 2.

DETAILED DESCRIPTION

Figure 1:
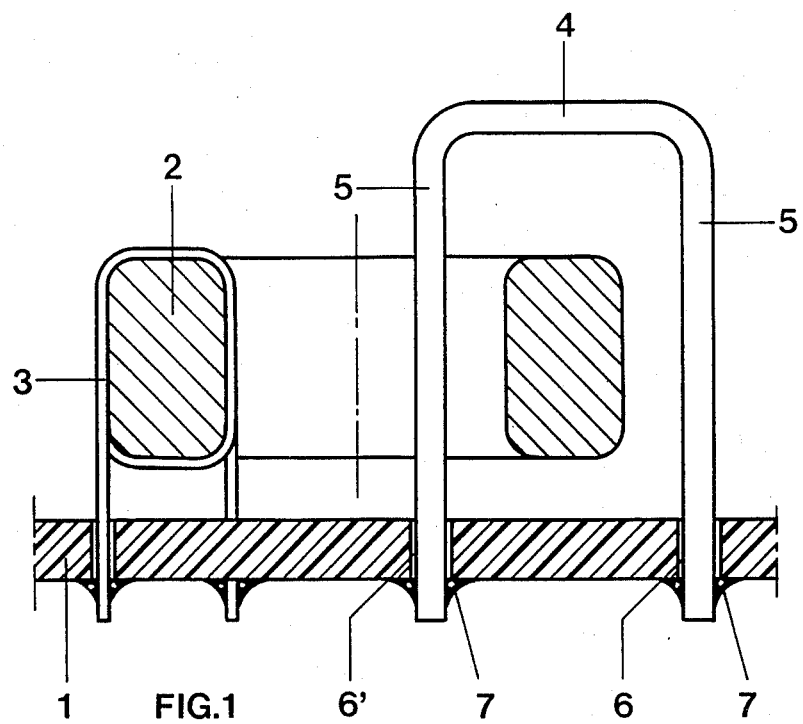
FIG. 1 illustrates, to a greatly enlarged scale, and not to proportion, a vertical cross section through a transformer core with a U-shaped inductive impedance.

A plastic printed circuit (PC) board, having conductive tracks at the bottom surface thereof (not visible in FIGS. 1 and 2) supports the ring core 2 of a saturation transformer. The ring core 2 is secured to the PC board by a primary winding 3, soldered to the conductive tracks (not shown).

An essentially U-shaped bent wire 4 surrounds the core 2. The bent wire 4 has longitudinal legs 5 which pass through openings 6, 6' in the PC board 1, and are secured by means of solder connections 7 to suitable conductive tracks on the bottom surface of the PC board.

Figure 2:
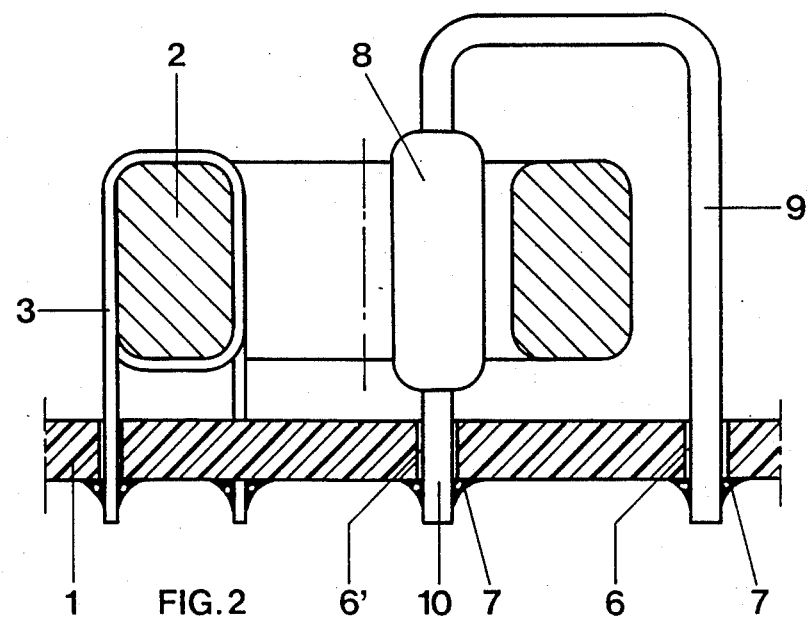
FIG. 2 is a view similar to FIG. 1, illustrating an inductive impedance-resistance combination.

In accordance with a feature of the invention, a resistor 8—see FIG. 2—is vertically located within the core 2. One of the terminal leads 9 of the resistor 8 is bent in approximately U shape about the core 2, outwardly, and guided through an outer opening 6 outside of the core 2; the second terminal lead 10 of the resistor 8 is connected directly through a second opening 6' to the side of the PC board 1 opposite the core 2.

Both connecting wires 9, 10 of the resistor 8 are then secured to suitable conductive tracks (not shown in FIG. 2) on the bottom side of the PC board 1 by solder connection 7.

FIG. 3 illustrates, schematically, the overall arrangement, in top view. The PC board 1, again, retains the core 2 thereon. Primary windings 3 are wound on the core 2. Two transistors 20, 20', shown schematically—and which may be in a single housing on a single chip, are connected by conductive tracks 22, 22' on the bottom side of the PC board 1 to U-shaped wires 21, 21' which form the upper connections from resistors 8, 8'. The wires 21, 21' correspond to the wires 9 of FIG. 2.

A compact fluorescent lamp 24, having two parallel legs, is electrically connected as schematically shown by connection bus 25, 25' to conductive tracks 23, 23' on the PC board 1 in accordance with known circuitry.

Various changes and modifications may be made within the scope of the inventive concept.

We claim:

1. Accessory circuit structure for a fluorescent lamp (24) having
    a printed circuit board (1) formed with conductive tracks thereon;
    a lamp operating circuit including circuit components for operating the lamp (24) having a transformer including a core body (2);
    a primary winding (3) on the core (2), said primary winding being electrically connected to selected conductive tracks, and mechanically securing the core on the printed circuit board (1),
    two impedance windings (5, 5; 21, 21') located on the core; and
    a pair of transistors (20, 20') connected to respective impedance windings,
wherein
    the impedance windings on the core comprise essentially U-shaped conductors (4, 5; 21, 21') having a pair of legs and at least in part surrounding the core;
    a solder connection (7) on the printed circuit board connecting terminal ends of the legs of the U-shaped wire to conductive tracks on the printed circuit board; and
    wherein the impedance windings include ohmic resistors (8) and terminal leads (9, 10) extending from the ohmic resistors, one of the legs of the U-shaped conductor being formed by the ohmic resistors, and the bend of the U and the other conductor being formed by a terminal wire of the resistor.

2. Circuit structure according to claim 1, wherein the core is a ring core, and the legs pass, respectively, outside and inside of the ring core.

3. Circuit structure according to claim 1, wherein the core comprises a ring core and the resistors are located at the inside of the ring core.

4. Circuit structure according to claim 1, wherein each impedance winding comprises at least two conductor loops, including two U-shaped conductors (4, 5; 21, 21');
    and the printed circuit board includes connection tracks
        for electrical connection between each of the U-shaped conductors to form an electrically continuous multiloop winding.

5. Circuit structure according to claim 4, wherein the core is a ring core, and the legs pass, respectively, outside and inside of the ring core.

6. Circuit structure according to claim 4, wherein the core comprises a ring core and the resistors are located at the inside of the ring core.

* * * * *